US007084615B1

(12) United States Patent
Pakbaz et al.

(10) Patent No.: US 7,084,615 B1
(45) Date of Patent: Aug. 1, 2006

(54) PERFORMANCE MEASUREMENT OF DEVICE DEDICATED TO PHASE LOCKED LOOP USING SECOND ORDER SYSTEM APPROXIMATION

(75) Inventors: Faraydon Pakbaz, Milton, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,412

(22) Filed: Feb. 18, 2005

(51) Int. Cl.
    *G01R 23/12* (2006.01)
    *G01R 27/28* (2006.01)
    *G06F 17/50* (2006.01)

(52) U.S. Cl. ............... 324/76.53; 324/615; 703/2; 703/14

(58) Field of Classification Search ......... 324/76.53, 324/615; 703/2, 14
    See application file for complete search history.

(56) References Cited

U.S. PATENT DOCUMENTS

| | | | |
|---|---|---|---|
| 3,611,168 A * | 10/1971 | Haggai | 329/325 |
| 5,887,030 A * | 3/1999 | Sasaki et al. | 375/229 |
| 6,043,724 A | 3/2000 | Frech et al. | |
| 6,385,565 B1 | 5/2002 | Anderson et al. | |
| 6,480,992 B1 | 11/2002 | Runyon | |
| 6,532,439 B1 | 3/2003 | Anderson et al. | |
| 6,571,184 B1 | 5/2003 | Anderson et al. | |
| 6,671,863 B1 * | 12/2003 | Gauthier et al. | 324/76.19 |
| 6,813,589 B1 * | 11/2004 | Li et al. | 324/613 |
| 2005/0152488 A1 * | 7/2005 | Buckwalter et al. | 375/350 |

* cited by examiner

*Primary Examiner*—Anjan Deb
*Assistant Examiner*—Timothy J. Dole
(74) *Attorney, Agent, or Firm*—Michael L. LeStrange; Hoffman, Warnick & D'Alessandro LLC

(57) ABSTRACT

A method, system and program product to measure performance of a device dedicated to a phase locked loop (PLL). A resistor-inductor-capacitor (RLC) model is produced to simulate the PLL. The RLC model and the device to be measured are mapped together into a test circuit and the characteristics of the test circuit is analyzed to determine whether the device, if attached to the PLL represented by the RLC model, can meet the required standard of performance. This invention can be used to measure the performance of all kinds of devices attached to all kinds of PLLs.

20 Claims, 12 Drawing Sheets

PERFORMANCE MEASUREMENT OF DEVICE DEDICATED TO PHASE LOCKED LOOP USING SECOND ORDER SYSTEM APPROXIMATION

TECHNICAL FIELD

The present invention relates generally to phase locked loop devices, and more particularly, to measuring performance of a device dedicated to a phase locked loop.

RELATED ART

Phase locked loops (PLL) devices have been used in many applications requiring a high degree of noise immunity and narrow bandwidth. A PLL operates by producing an oscillator frequency to match the frequency of an input signal. Any change in input frequency first appears as a change in phase between input frequency and oscillator frequency. The phase change then acts as an error signal to change the frequency of the PLL oscillator to match the frequency of input. The locking onto a phase relationship between input frequency and oscillator frequency accounts for the name phase locked loop.

To improve the performance of a PLL, various components and devices can be added to the PLL. Devices dedicated to PLLs include, for example, decoupling capacitors, which are used to minimize PLL output jitter. In a typical Application Specific Integrated Circuit (ASIC) application of a PLL, the relatively noisy digital supply used for logic and I/Os is also responsible for inducing jitter on the input clocks to PLL circuits. This input jitter may degrade the PLL performance so actions are taken to minimize input jitter. Adding decoupling capacitors in the vicinity of PLL is one of these actions that may be implemented.

In designing the device/component dedicated to a PLL, simulation is needed to determine the performance of it as it is used with the PLL. Traditionally, detecting performance of a device dedicated to a PLL requires lengthy closed loop simulation using tools such as SPICE. Because this type of simulation, including a closed loop simulation of a PLL together with a device added to it, is very time-consuming to conduct, design of a device dedicated to a PLL is inconvenient and complicated.

In view of the foregoing, there is a need for an easy and simplified method to simulate a PLL with a device added to it, which enables quick simulation and determination of the performance of the device.

SUMMARY OF THE INVENTION

The invention includes a method, system and program product to measure performance of a device dedicated to a phase locked loop (PLL). A resistor-inductor-capacitor (RLC) model is produced to simulate the PLL. The RLC model and the device to be measured are mapped together into a test circuit and the characteristics of the test circuit are analyzed to determine whether the device, if attached to the PLL represented by the RLC model, can meet the required standard of performance. This invention can be used to measure the performance of all kinds of devices attached to all kinds of PLLs.

A first aspect of the invention is directed to a method of measuring performance of a device dedicated to a phase locked loop, the method comprising the steps of: representing the phase locked loop with a second order transfer function; generating a resistor-inductor-capacitor (RLC) model based on the second order transfer function; coupling the RLC model and the device together to make a test circuit; and analyzing a characteristic of the test circuit to determine the performance of the device.

A second aspect of the invention is directed to a system for measuring performance of a device dedicated to a phase locked loop, the system comprising: means for representing the phase locked loop with a second order transfer function; means for generating a resistor-inductor-capacitor (RLC) model based on the second order transfer function; means for coupling the RLC model and the device together to make a test circuit; and means for analyzing a characteristic of the test circuit to determine the performance of the device.

A third aspect of the invention is directed to a computer program product comprising a computer usable medium having computer readable program code embodied therein for measuring performance of a device dedicated to a phase locked loop, the program product comprising: program code configured to represent the phase locked loop with a second order transfer function; program code configured to generate a resistor-inductor-capacitor (RLC) model based on the second order transfer function; program code configured to design a coupling of the RLC model and the device together to make a test circuit; and program code configured to analyze a characteristic of the test circuit to determine the performance of the device.

The foregoing and other features and advantages of the invention will be apparent from the following more particular description of preferred embodiments of the invention.

BRIEF DESCRIPTION OF THE DRAWINGS

The preferred embodiment of this invention will be described in detail, with reference to the following figures, wherein like designations denote like elements, and wherein.

DETAILED DESCRIPTION OF THE INVENTION

Figure 1:
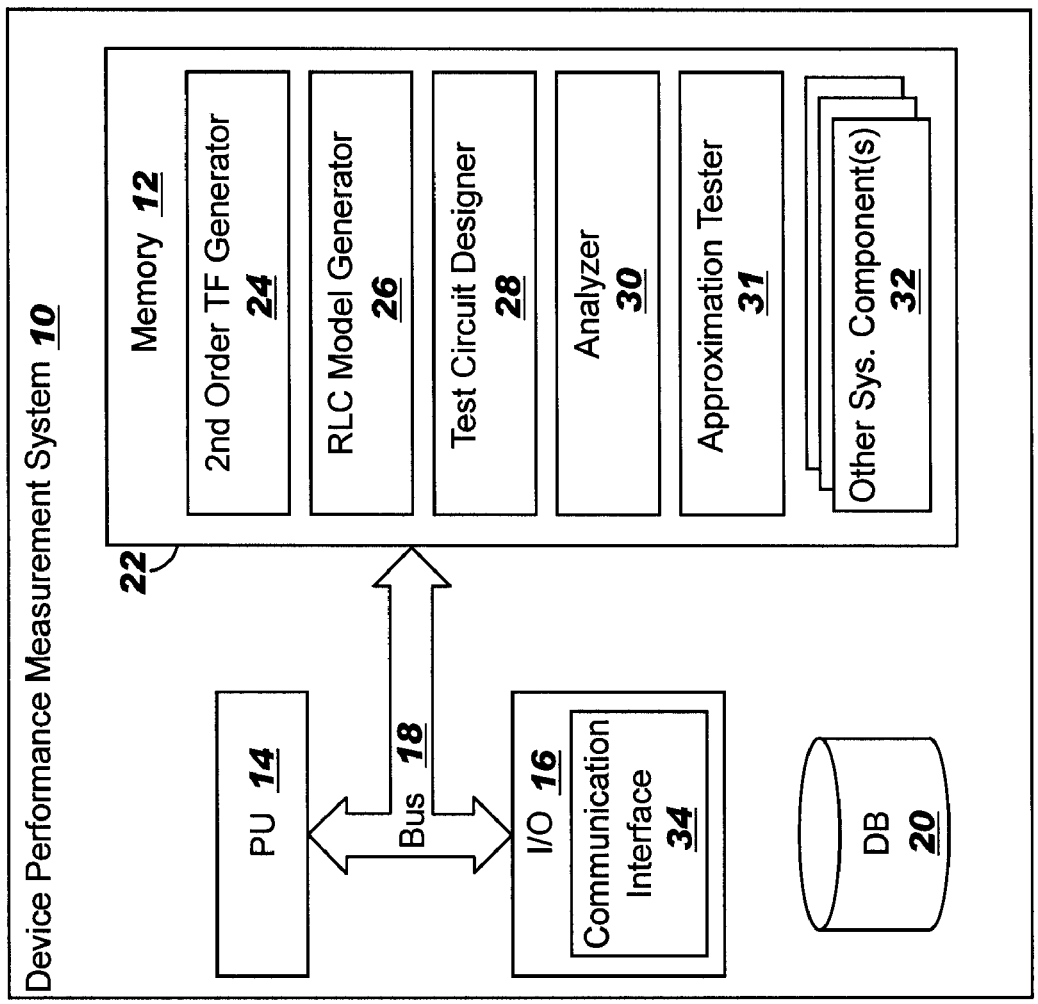
FIG. 1 shows a block diagram of a device performance measurement system in accordance with the invention.

With reference to the accompanying drawings, FIG. 1 is a block diagram of a phase locked loop device performance measurement system 10 in accordance with the invention.

Measuring system 10 preferably includes a memory 12, a processing unit (PU) 14, input/output devices (I/O) 16 and a bus 18. A database 20 may also be provided for storage of data relative to processing tasks. Memory 12 preferably includes a program product 22 that, when executed by PU 14, comprises various functional capabilities described in further detail below. Memory 12 (and database 20) may comprise any known type of data storage system and/or transmission media, including magnetic media, optical media, random access memory (RAM), read only memory (ROM), a data object, etc. Moreover, memory 12 (and database 20) may reside at a single physical location comprising one or more types of data storage, or be distributed across a plurality of physical systems. PU 14 may likewise comprise a single processing unit, or a plurality of processing units distributed across one or more locations. I/O 16 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 1, program product 22 may include a second order transfer function (TF) generator 24, a resistor-inductor-capacitor (RLC) model generator 26, a test circuit designer 28, an analyzer 30, an approximation tester 31 and other system components 32. Other system components 32 may be any complementary functions to measurement system 10 not explicitly delineated below.

As also shown in FIG. 1, I/O 16 may include a communication interface 34 to enable the system to communicate with a user during operation.

Figure 2:
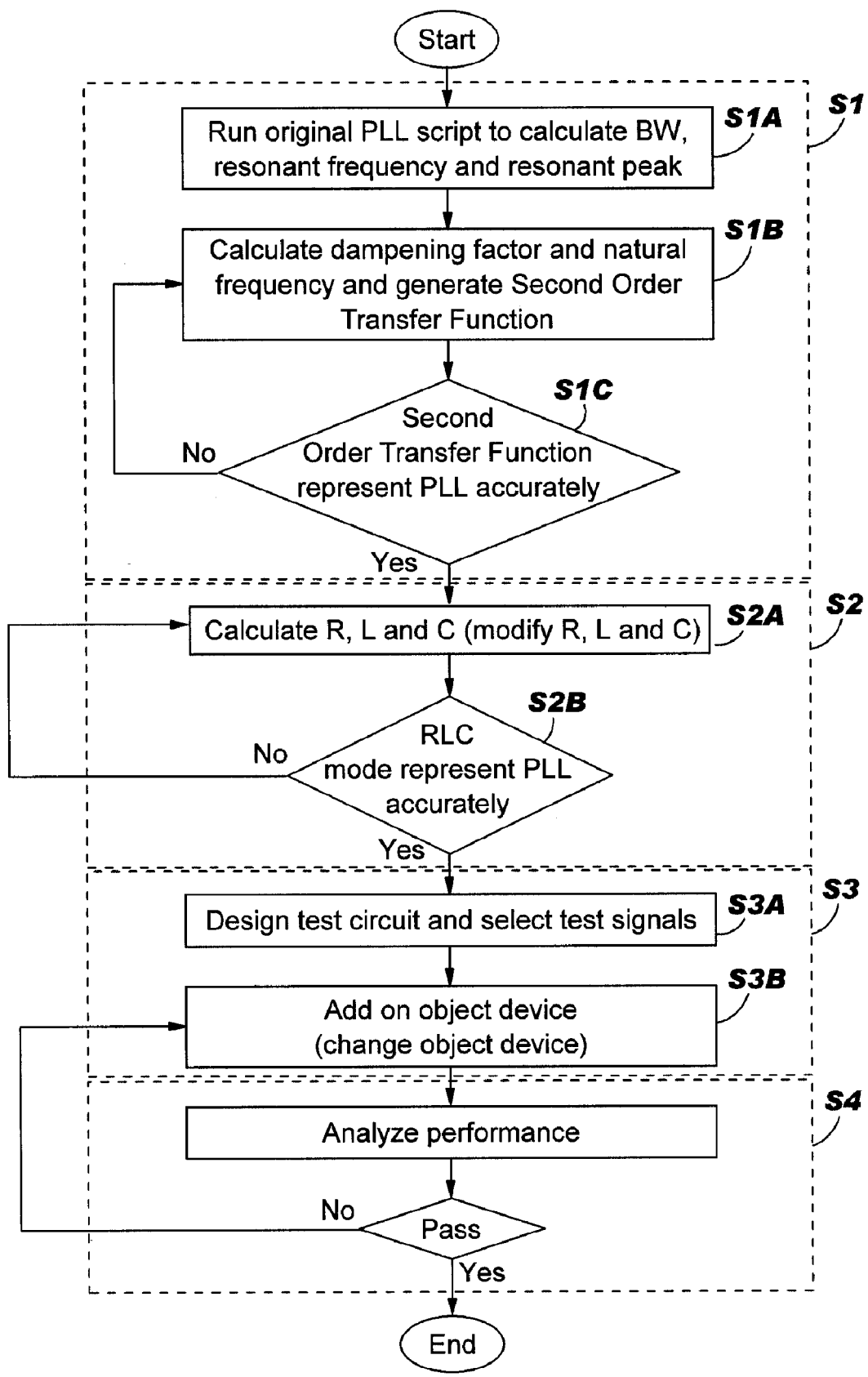
FIG. 2 shows a flow diagram of a method in accordance with the invention.

Operation of system 10 and implementation of the method will be described relative to FIGS. 2–12. FIG. 2 shows a flow diagram of the operation of the measurement system 10. In a first step S1, TF generator 24 first, at step S1A, simulates a frequency response and a step response of a phase locked loop that a device is dedicated to. The simulation can be done through any known or future developed methods of simulation, such as SPICE, EESof® available from Hewlett Packard®, Matlab® available from MathWorks®, and other analytical/behavioral models.

Figure 3:
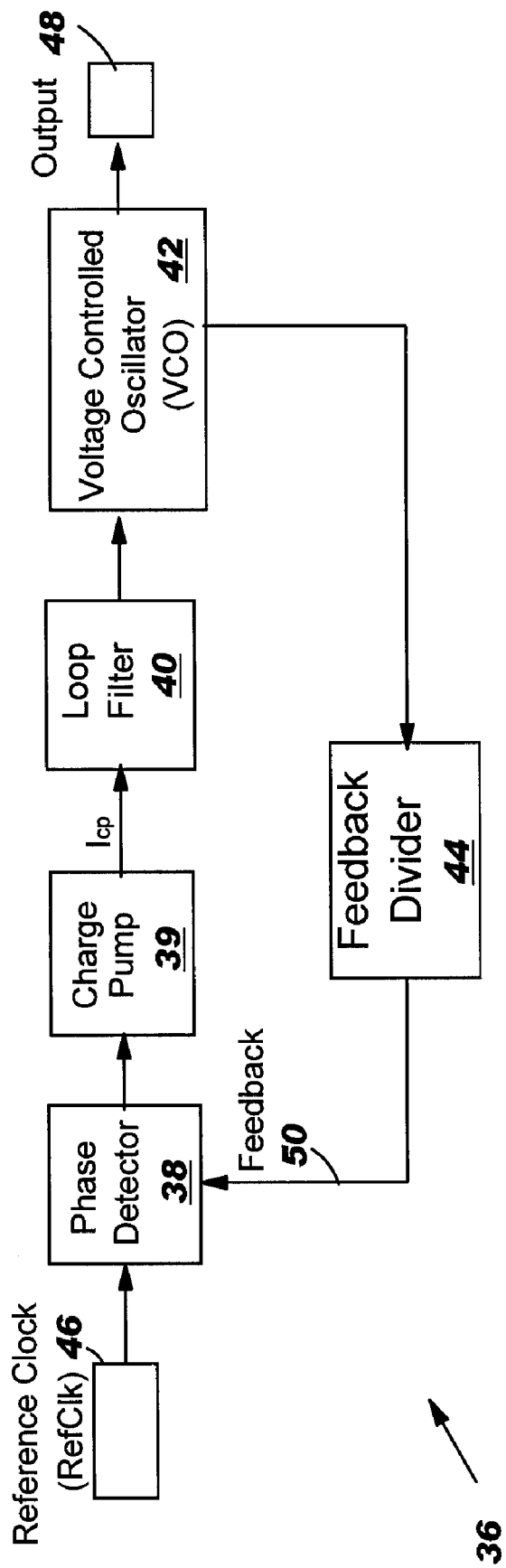
FIG. 3 shows a block diagram of a typical PLL.

A typical block of PLL 36 is shown in FIG. 3. As shown in FIG. 3, PLL 36 includes a phase detector 38, a charge pump 39, a loop filter 40 and a voltage controlled oscillator (VCO) 42. A feedback divider 44 is coupled between phase detector 38 and an output 48. Divider 44 transfers output 48 into feedback 50. For illustration of the invention, a simulation is made to an example PLL 36 having VCO=1240 Mhz and a reference clock (Refclk)=155 Mhz, using Matlab® Script.

Figure 4:
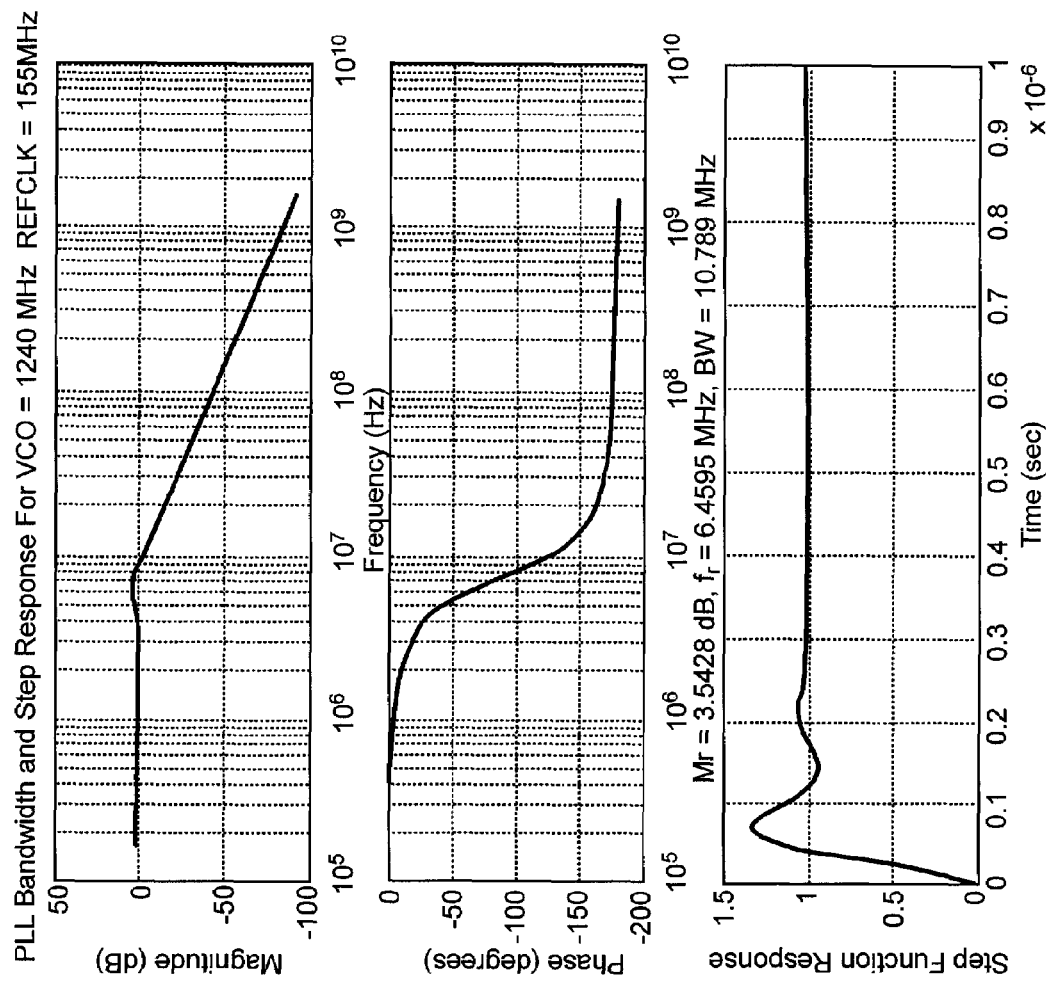
FIG. 4 shows a set of response curves of the PLL of FIG. 3.

FIG. 4 shows the results of the simulation of PLL 36 (FIG. 3). Three separate response curves: "Magnitude v. Frequency," "Phase v. Frequency" and "Step response" of PLL 36 (FIG. 3) are shown. Those set of curves are unique for each Application Specific Integrated Circuit (ASIC application) of PLL 36 (FIG. 3) due to the unique reference clock (Refclk) and voltage controlled oscillator (VCO) required for the application. Using, for example, Matlab® Script, at step S1A (FIG. 2), TF generator 24 (FIG. 1) obtains resonance frequency ($f_r$), resonance peak ($\omega_r$) and bandwidth (BW) of PLL 36 (FIG. 3). Here, $f_r$=6.4595 Mhz, $\omega_r$=3.5428 dB and BW=10.789 Mhz.

Based on the values of resonance frequency ($f_r$), resonance peak ($\omega_r$) and bandwidth (BW), at step S1B (FIG. 2), TF generator 24 (FIG. 1) calculates the dampening factor ($\zeta$) and the natural frequency ($\omega_n$) for a second order transfer function according to the following algorithms:

$$\omega_n = \frac{\omega_r}{\sqrt{1-2\zeta^2}} \tag{1}$$

$$BW = \omega_n(\sqrt{1-2\zeta^2 + \sqrt{4\zeta^4 - 4\zeta^2 + 2}}, \text{ or}$$

$$BW = \frac{\omega_r}{\sqrt{1-2\zeta^2}}\left(\sqrt{1-2\zeta^2 + \sqrt{4\zeta^4 - 4\zeta^2 + 2}}\right) \tag{2}$$

$$TF = \frac{\omega_n^2}{s^2 + 2\zeta\omega_n s + \omega_n^2} \tag{3}$$

In those algorithms, $\omega_n$ is natural frequency; $\omega_r$ is another form of resonance frequency, wherein $\omega_r=2\pi f_r$; $\zeta$ is dampening factor; BW is bandwidth; TF is transfer function; and S is time.

Given that we already know resonance frequency ($f_r$), here 6.4595 Mhz (or $\omega_r=2\pi f_r=40.586$ M(rad/sec)), and bandwidth (BW), here 10.789 Mhz, from the above simulation of PLL 36 (FIG. 3), at step S1A, there is only one unknown variable in equation (2). Introducing the values of $\omega_r$ and BW into equation (2), TF generator 24 (FIG. 1) obtains the value of $\zeta$. Here $\zeta$=0.3574.

Introducing the value of dampening factor ($\zeta$) and resonance frequency $\omega_r$ into equation (1), TF generator 24 (FIG. 1) obtains the value of natural frequency ($\omega_n$). Here, $\omega_n$=47.037 M(rad/sec).

Introducing the values of dampening factor ($\zeta$) and natural frequency $\omega_n$ into equation (3), TF generator 24 (FIG. 1) obtains a second order transfer function. Here:

$$TF = \frac{2.212e15}{s^2 + 3.362e7s + 2.212e15}$$

After obtaining the second order transfer function, approximation tester 31 (FIG. 1), at step S1C (FIG. 2), tests whether the second order transfer function accurately represents PLL 36 (FIG. 3). Specifically, approximation tester 31 (FIG. 1) simulates bandwidth and step response of the second order transfer function and compares them with those of PLL 36 (FIGS. 3–4). If the two sets of responses correlate sufficiently, i.e., correlation meets a preset standard, system 10 (FIG. 1) proceeds to step S2 (FIG. 2); if not, TF generator 24 (FIG. 1) adjusts the second order transfer function (step S1B, FIG. 2) and approximation tester 31 reiterates the testing again (step S1C, FIG. 2). The testing can be done by the system itself using program code or can be done separately by a user through communication interface 34 (FIG. 1). It is evident that use of other known or future developed methods for testing the accuracy of the second order transfer function is also included in the current invention. It is also evident that use of any method to simulate the response of the second order transfer function is within the scope of the invention.

Figure 5:
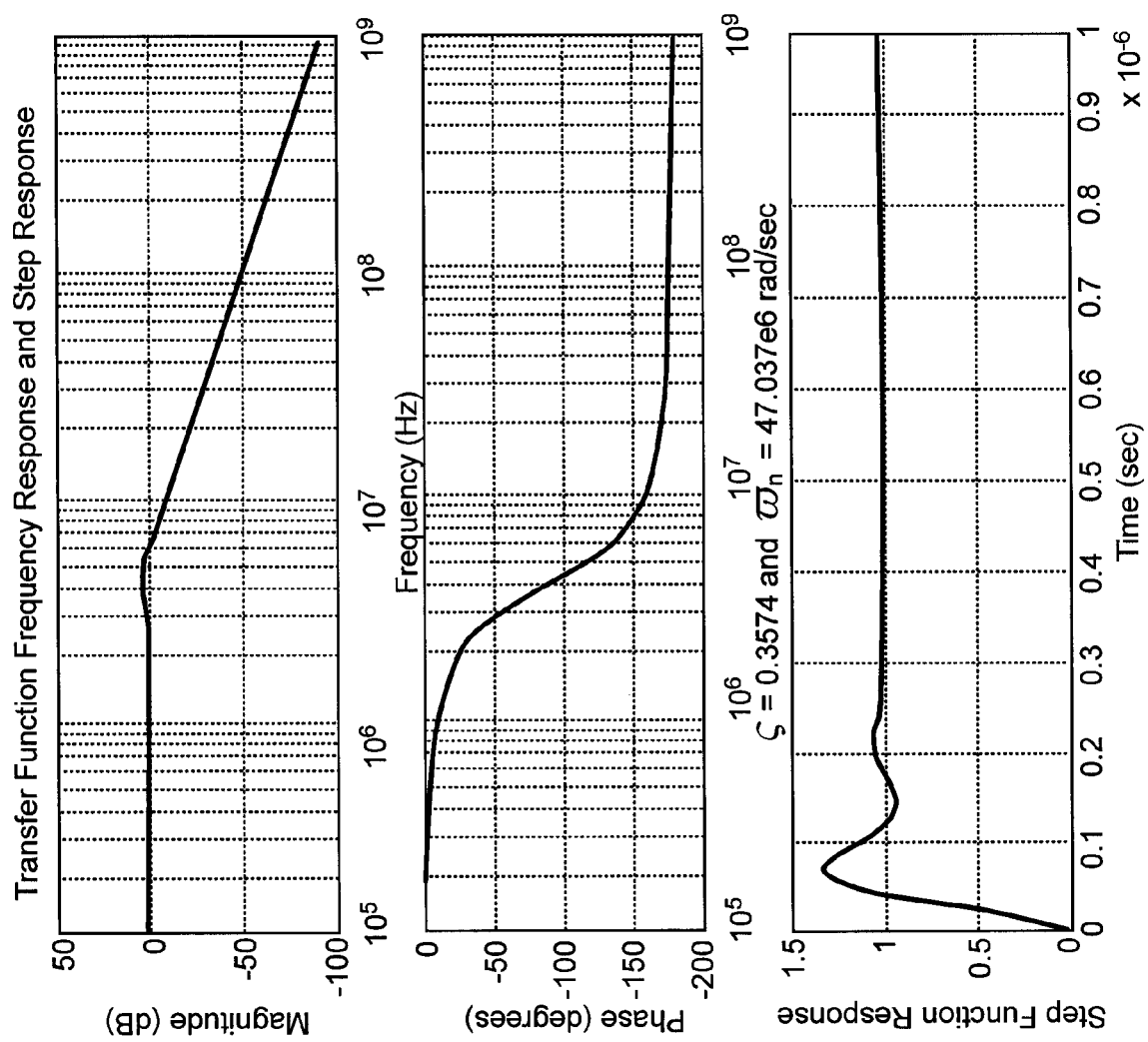
FIG. 5 shows a set of response curves of a second order transfer function of the PLL of FIG. 3.

FIG. 5 shows frequency response curves, "Magnitude v. Frequency," and "Phase v. Frequency" and a step response curve, "Step response," of the second order transfer function from a Matlab® simulation. Comparing FIG. 5 to FIG. 4 shows excellent correlation. In this case, system 10 would proceed to the next step, S2 (FIG. 2).

At step S2, shown in FIG. 2, RLC generator 26 (FIG. 1), at step S2A, calculates the values of a resistor, an inductor and a capacitor of a RLC model used to represent PLL 36 (FIG. 3). The equations for the calculation are as follows:

$$\omega_n = \frac{1}{\sqrt{LC}} \quad (4)$$

$$\zeta = \frac{R}{2}\sqrt{\frac{C}{L}} \quad (5)$$

In those equations, $\omega_n$ is natural frequency; $\zeta$ is dampening factor; R is resistance; L is inductance; and C is capacitance.

$\omega_n$ and $\zeta$ are known from step S1 (FIG. 2). As a consequence, there are three unknown variables in two equations. To solve the problem, RLC generator 26 (FIG. 1) first randomly selects a value for the capacitor. Here, using the cell value given in data book for PLL area and assuming 7e-15f for each cell in CU-II of PLL 36, RLC generator 26 (FIG. 1) calculates the value of the resistance approximately as:

$C=(149878)(7e-15fF)=1.1$ nF

Incorporating the value of the capacitance into equation (4), RLC generator 26 (FIG. 1) obtains the value for the inductance. Here L=0.41 µH. Incorporating the value of the capacitance (C) and the inductance (L) into equation (5), RLC generator 26 (FIG. 1) obtains the value of the resistance. Here R=13.8 ohms.

After obtaining the RLC model, at step S2B, approximation tester 31 (FIG. 1) tests whether the RLC model accurately represents PLL 36 (FIG. 3). Preferably, there are two test procedures for the testing. One is that approximation tester 31 (FIG. 1) compares bandwidth and step response of the RLC model with those of PLL 36 (FIGS. 3–4). Another is that approximation tester 31 (FIG. 1) compares bandwidth and step response of the RLC model with those of the second order transfer function generated at step S1 (FIG. 2). A user may preset system 10 (FIG. 1) to use one of the two procedures or both. Also a user and system 10 (FIG. 1) may communicate during the process, through communication interface 34 (FIG. 1), about which test procedure to use. A user can also preset a standard for a test procedure or communicate with system 10 (FIG. 1) during the procedure about the standard of testing. As shown in FIG. 2, if the RLC model meets the standard, system 10 (FIG. 1) proceeds to the next step, step S3; if the RLC model does not meet the standard, system 10 (FIG. 1) goes back to step S2A and RLC generator 26 (FIG. 1) modifies the values of the resistor, inductor and capacitor of the RLC model and approximation tester 31 (FIG. 1) reiterates the test again at step S2B. Generally, RLC model generator 26 (FIG. 1) does not modify the value of the capacitor because that value is selected from the data book. RLC generator 26 (FIG. 1) will generally modify the values of the resistor and the inductor. The modification of the values of the resistor, inductor and possibly the capacitor can be conducted by RLC generator 26 (FIG. 1) automatically according to certain standards preset by a user. Alternatively, a user may modify the values of the resistor, inductor and capacitor through communication interface 34 (FIG. 1). This process may reiterate many times until the RLC model accurately represents PLL 36 (FIG. 3).

Figure 6:
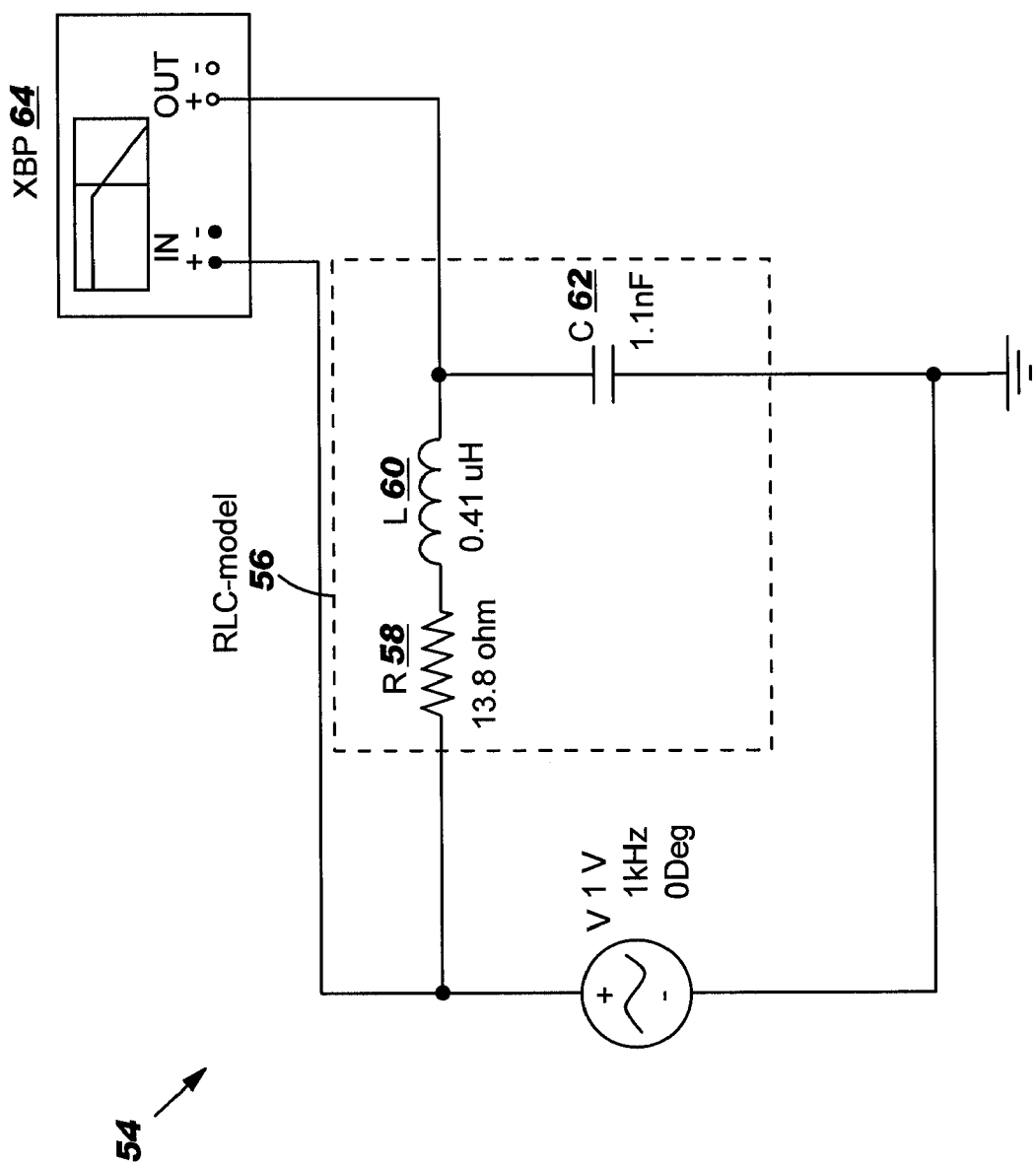
FIG. 6 shows a circuit environment setting for simulating frequency response of a RLC model.

Any known or future developed simulation methods can be used to simulate the response of the RLC model. FIG. 6 shows a test circuit 54 to simulate the bandwidth of RLC model 56 using MultiSim® (SPICE) available from Electronics Workbench®. The mapping of resistor (R) 58, inductor (L) 60 and capacitor (C) 62 is well known in the field. A bode plotter (XBP) 64 is coupled to measure input 66 and output of the RLC model. The values of resistor 58, inductor 60 and capacitor 62 are those calculated by RLC generator 26 (FIG. 1) at step S2A.

Figure 7:
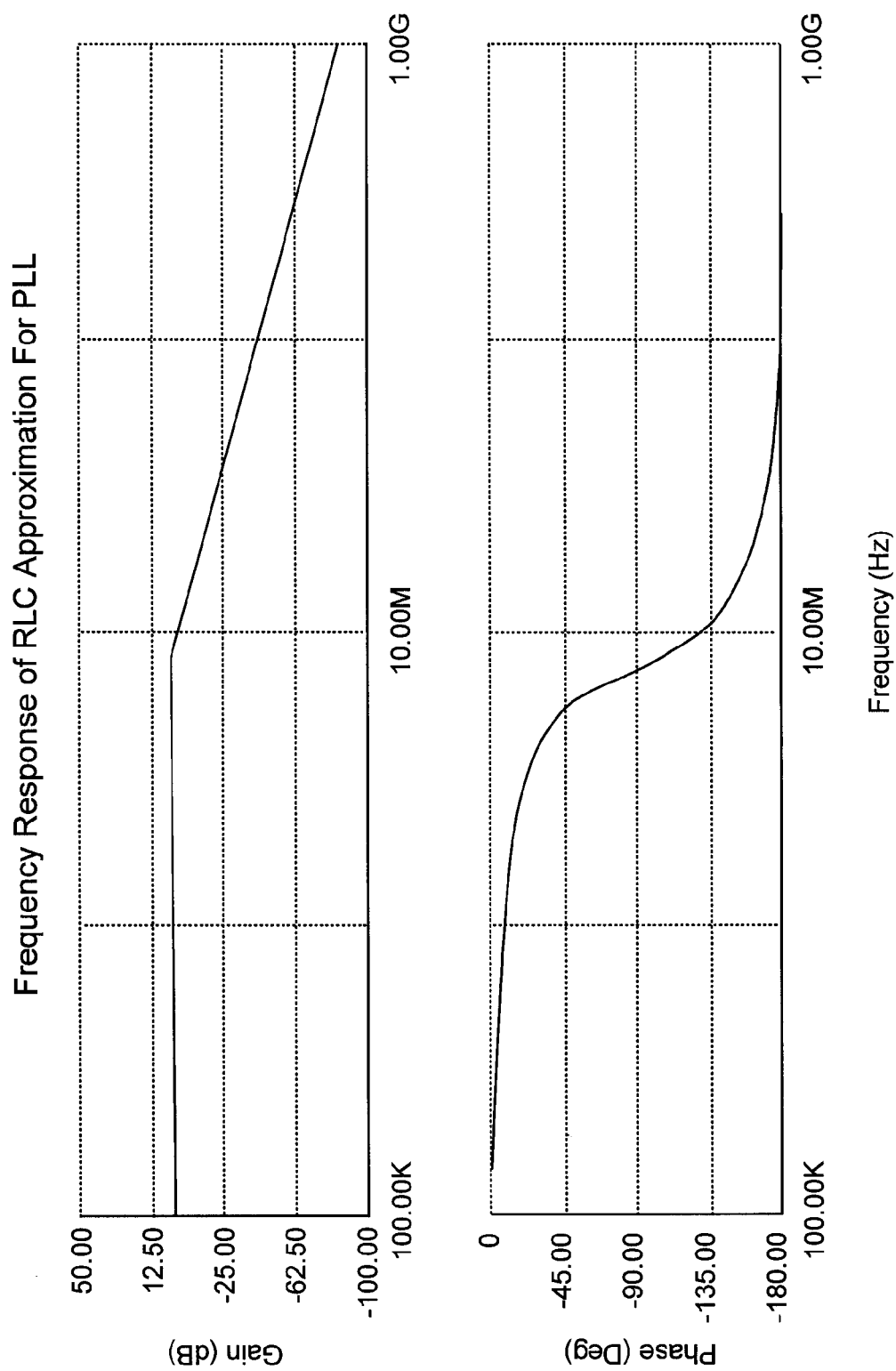
FIG. 7 shows profiles of frequency response of a RLC model.

FIG. 7 shows "Magnitude v. Frequency" and "Phase v. Frequency" plots of the frequency response of RLC model 56 (FIG. 6). Comparing the two plots in FIG. 7 with those in FIG. 4 and FIG. 5 shows excellent correlation.

Figure 8:
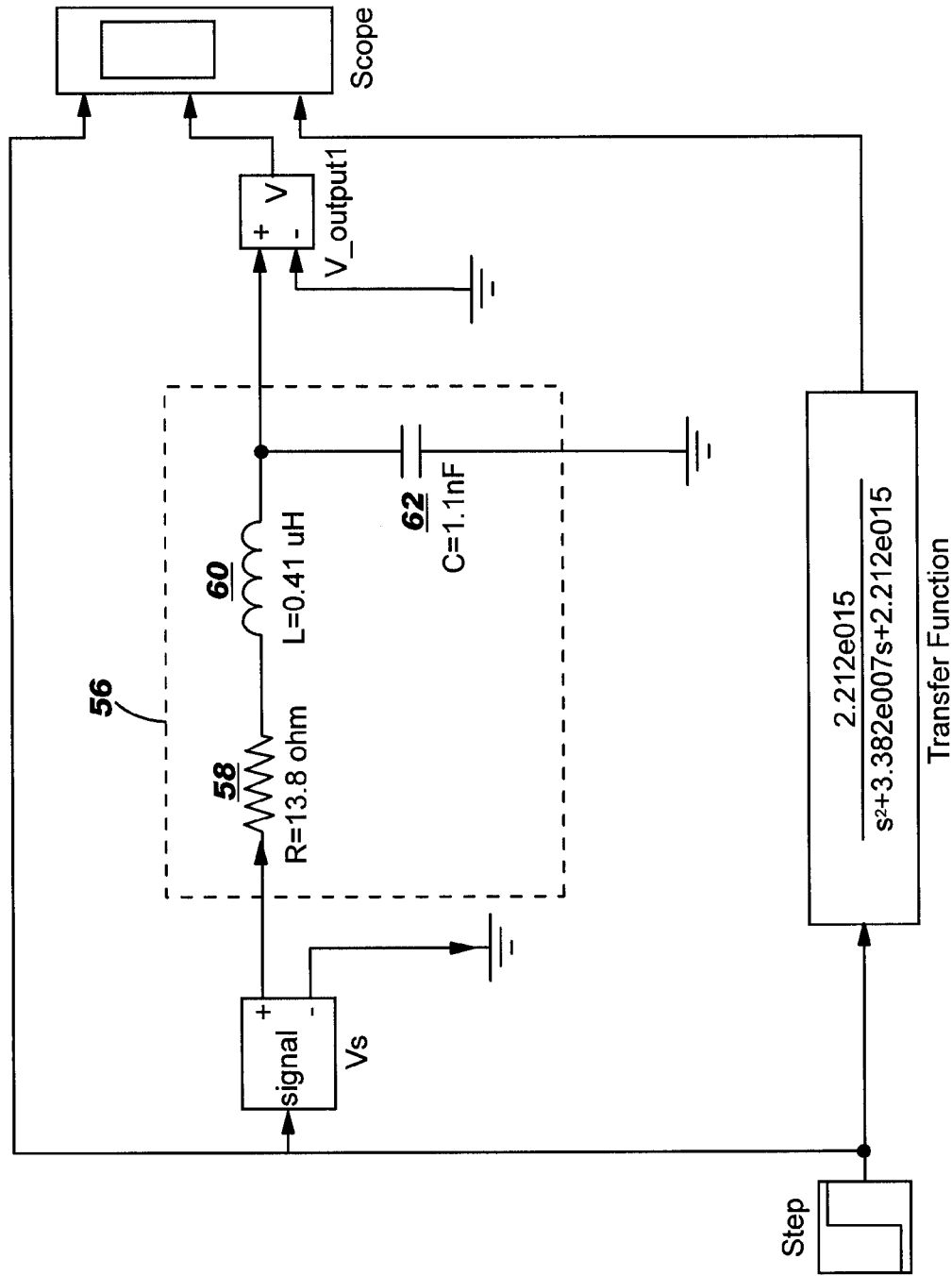
FIG. 8 shows a circuit environment setting for simulating step response of a RLC model and a second order transfer function.
Figure 9:
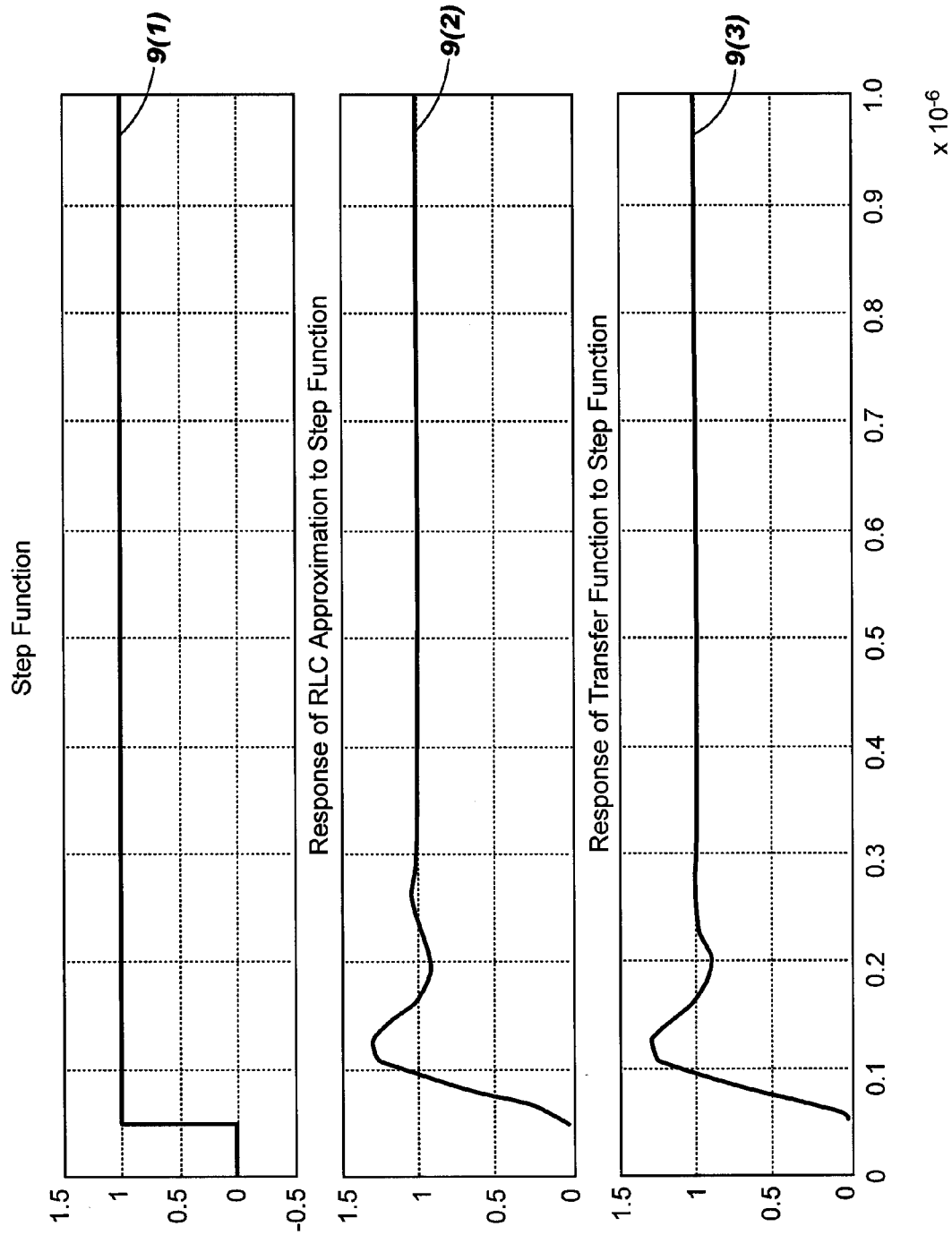
FIG. 9 shows profiles of step responses of the RLC model and the second order transfer function of FIG. 8.

FIG. 8 shows a test circuit 68 for simulating and comparing the step response of RLC model 56 with that of the second order transfer function using, for example, Matlab® Simulink® and Simpower® environments. The mapping of RLC model 56, the second order transfer function and other components in test circuit 68 is well known in the field. FIG. 9 shows the profile of the step response of RLC model 56 (FIG. 8), 9(2), and the profile of the step response of the second order transfer function (FIG. 8), 9(3). Comparing profiles 9(2) and 9(3) shows excellent correlation. In this case, system 10 (FIG. 1) proceeds to the next step, step S3 (FIG. 2).

Returning to FIG. 2, at step S3, test circuit designer 28 (FIG. 1), at step S3A, designs a circuit environment to test the performance of a device dedicated to PLL 36 (FIG. 3) and selects test signals according to the function of the device. Test circuit designer 28 (FIG. 1) selects a manner of coupling RLC model 56 (FIG. 6) and the device together based on the manner that the device is supposed to be coupled to PLL 36 (FIG. 3). In addition, in selecting the coupling manner, test circuit designer 28 (FIG. 1) also considers the convenience of decoupling and recoupling the device, because in the process of testing, the device may be modified and the testing may be reiterated many times. Test circuit designer 28 (FIG. 1) selects test signal input to the test circuit according to the function of the device to facilitate the analysis of the performance of the device based on the response of the test circuit to the test signal input.

At step S3B (FIG. 2), a device dedicated to PLL 36 (FIG. 3) is attached into the test circuit designed at step S3A. Step S3B is separate to step S3A, because in the operation of system 10, step S3B might be reiterated many times. Design of a device dedicated to PLL 36 (FIG. 3) might be modified many times according to the performance measurement, and every modification of design reiterates step S3B, while reiteration of step S3A is not necessary.

Figure 10:
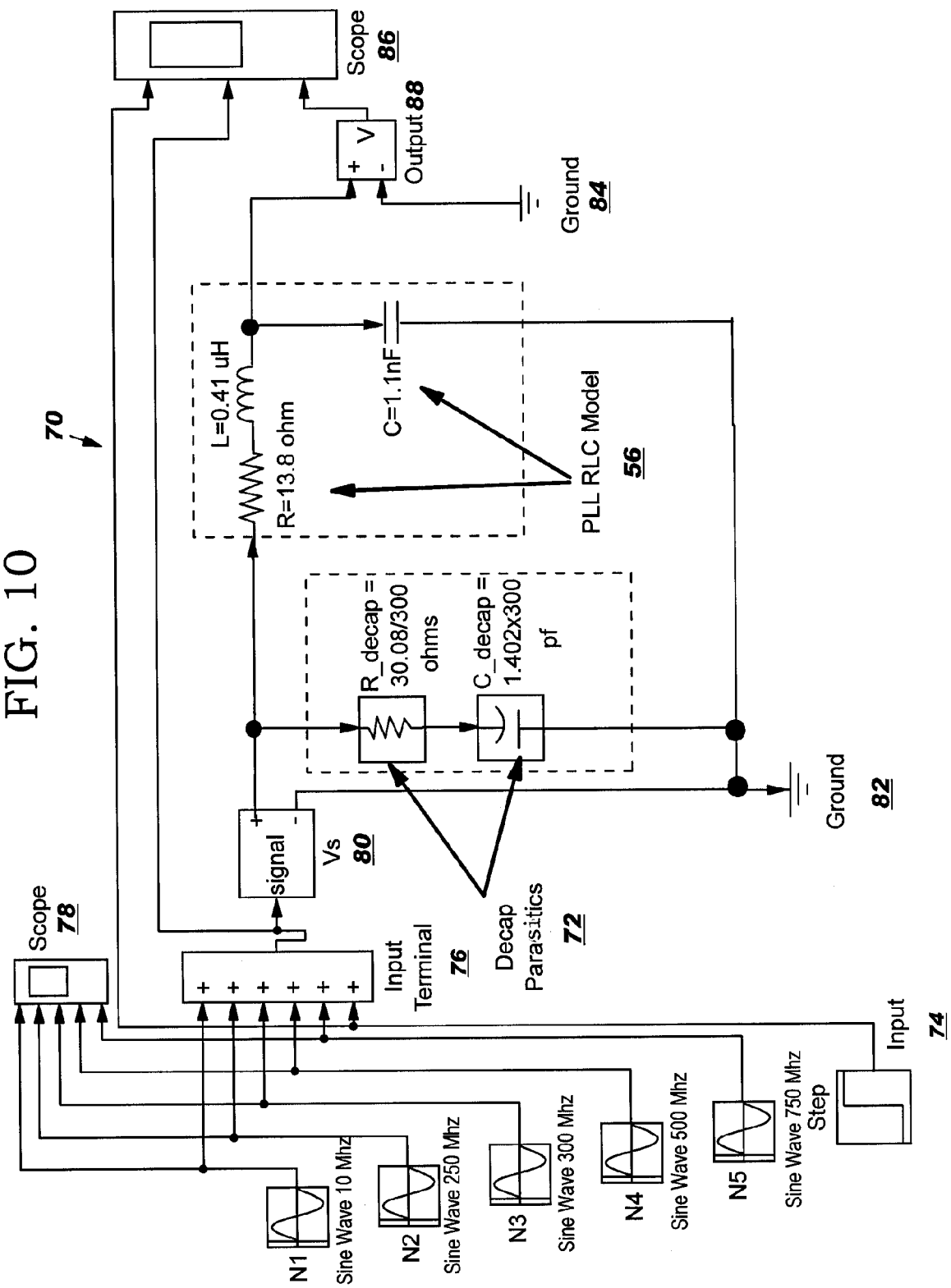
FIG. 10 shows a circuit environment setting for simulating performance of a device dedicated to a PLL.

FIG. 10 shows a test circuit 70 for testing performance of an on-chip decoupling device, Decap Parasitics 72. Decap Parasitics 72 is dedicated to PLL 36 (FIG. 3) and functions to minimize PLL 36 (FIG. 3) output jitter caused by possible input jitter on reference clock 46 (FIG. 3). Because Decap Parasitics 72 is used to minimize PLL 36 (FIG. 3) output jitter, test circuit designer 28 (FIG. 1) selects five noise harmonics, N1–N5, of different frequencies and magnitudes to simulate input jitter. As shown in FIG. 10, N1–N5 and a step function 74 are coupled together to input terminal 76 of test circuit 70 to form a noisy step function. Scope 78 is coupled to N1–N5 to measure their profiles. As shown in FIG. 10, Decap Parasitics 72 is coupled between signal 80 and ground 82, which is similar as if it is coupled to PLL 36 (FIG. 3). Another scope 86 is coupled to measure step function 74, noisy step function of input terminal 76 and output 88. Output 88 is coupled to another ground 84. It is evident that any manner of setting test circuit 70 including coupling RLC model 56 with device 72 is included in the current invention.

In FIG. 10, the noise harmonics in input terminal 76 will translate to PLL reference/feedback clock phase noise due to voltage modulation of clock buffers located in the noisy digital domain of the chip. This reality allows a voltage waveform to represent phase noise and the RLC model 56 to predict the sensitivity of the PLL 36 (FIG. 3) to the incoming phase jitter. Although the amplitude of incoming clock (Refclk 46, FIG. 3) is not modeled in FIG. 10, the frequency content of the jitter is accurate. Based solely on the frequency content, a decision can be made on the performance of Decap Parasitics 72.

Figure 11:
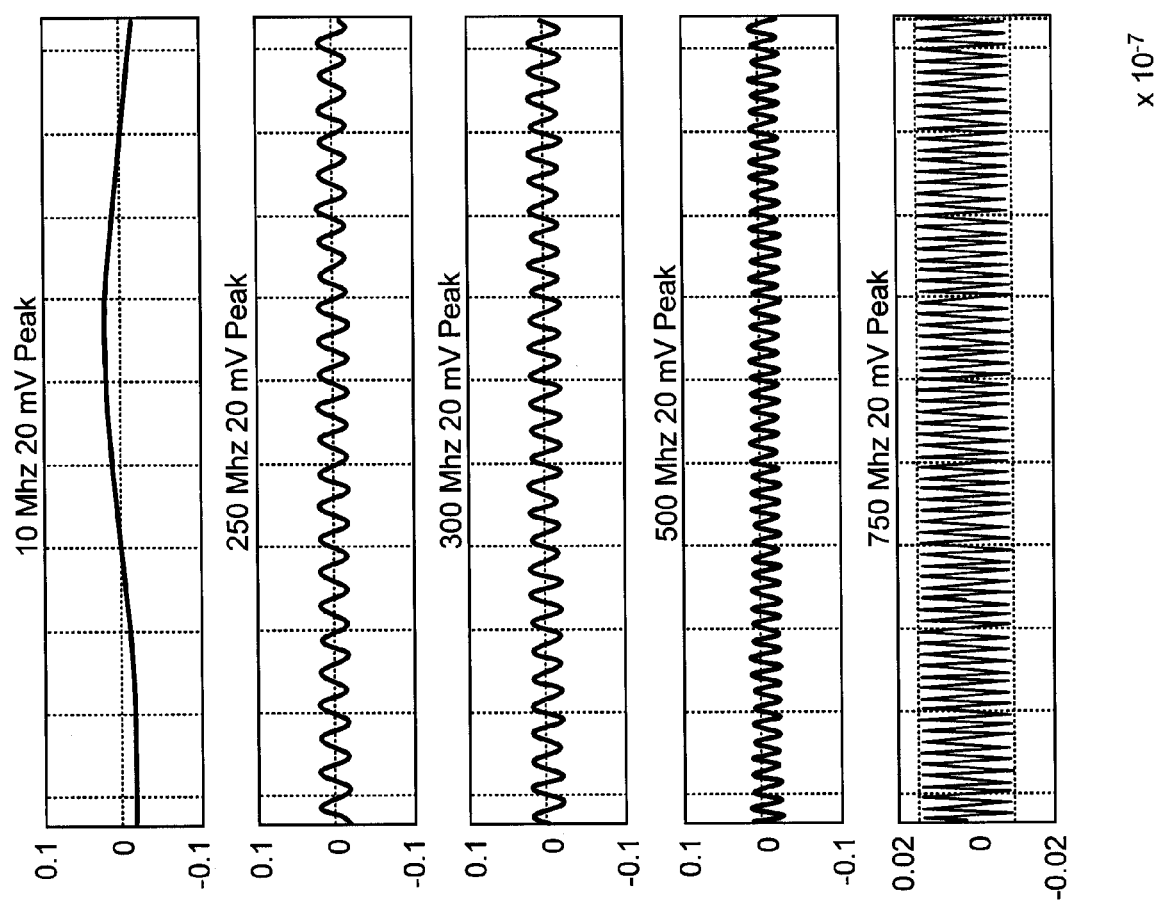
FIG. 11 shows profiles of noise signals for simulating input jitter.
Figure 12:
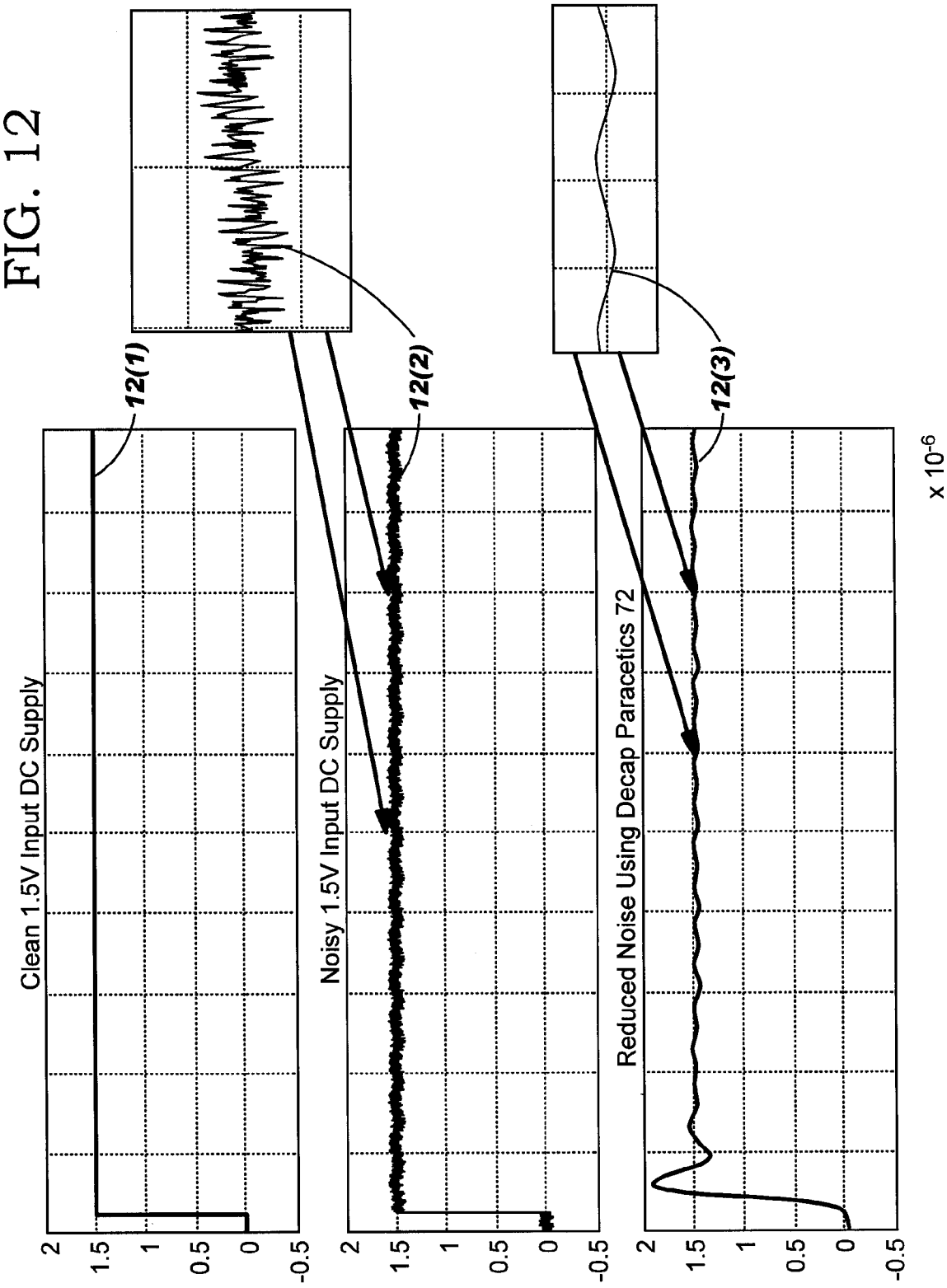
FIG. 12 shows profiles of a noisy step function and output of the circuit environment of FIG. 10.

FIG. 11 shows the profiles of the five noise harmonics, N1–N5, measured by scope 78. FIG. 12 shows the measurement of the scope 86, wherein 12(2) is the profile of the noisy step function and 12(3) is the profile of the response of test circuit 70.

Returning to FIG. 2, at step S4, analyzer 30 (FIG. 1) analyzes the measurements of test circuit 70 (FIG. 10) to determine the performance of device 72 (FIG. 10). At step S4, analyzer 30 (FIG. 1) may communicate measurements of test circuit 70 (FIG. 10) to a user, and enable an analysis by the user. Alternatively, analyzer 30 (FIG. 1) may analyze test circuit 70 (FIG. 10) measurements automatically by the program code according to standards preset by a user or input by a user through communication interface 34 (FIG. 1). If the analysis by analyzer 30 (FIG. 1) shows that performance of device 72 (FIG. 10) meets a standard preset for device 72, the operation of system 10 (FIG. 1) will complete. If the analysis by analyzer 30 (FIG. 1) shows that the performance of device 72 (FIG. 10) fails to meet a standard, design of device 72 (FIG. 10) will be modified accordingly and system 10 (FIG. 1) will reiterate step S3B by adding modified device 72 onto test circuit 70 (FIG. 10). Measurements of test circuit 70 (FIG. 10) with modified device 72 (FIG. 10) will be analyzed again by analyzer 30 (FIG. 1). This process will reiterate many times until the performance of device 72 (FIG. 10) meets the standard.

Analysis of FIG. 12 shows that all high frequencies of noise harmonics have been attenuated, with exception of noise harmonics N1 of 10 Mhz. This result can be analyzed with a performance standard set for Decap Parasitics 72 (FIG. 10) to determine whether, if used with PLL 36 (FIG. 3), Decap Parasitics 72 (FIG. 10) can function as to minimize PLL 36 (FIG. 3) output jitter.

In the previous discussion, it will be understood that the method steps discussed are performed by a processor, such as PU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which, when loaded in a computer system, is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of measuring performance of a device dedicated to a phase locked loop, the method comprising the steps of:
   representing the phase locked loop with a second order transfer function;
   generating a resistor-inductor-capacitor (RLC) model based on the second order transfer function;
   coupling the RLC model and the device together to make a test circuit; and
   analyzing a characteristic of the test circuit to determine the performance of the device.

2. The method of claim 1, wherein the step of representing the phase locked loop includes measuring a response curve of the phase locked loop.

3. The method of claim 2, wherein the step of representing the phase locked loop further includes determining a resonance frequency and a bandwidth based on the response curve.

4. The method of claim 3, wherein the step of representing the phase locked loop further includes calculating a dampening factor and a natural frequency based on the resonance frequency and the bandwidth.

5. The method of claim 2, wherein the step of the measuring the response curve includes using a simulation system.

6. The method of claim 1, wherein the step of generating the RLC model includes:
   randomly selecting a value for a capacitor in the RLC model;
   calculating a value for an inductor based on the value of the capacitor and a value of a natural frequency of the second order transfer function; and
   calculating a value for a resistor based on the value of the capacitor, the value of the inductor and a dampening factor of the second order transfer function.

7. The method of claim 1, wherein the RLC model includes at least one resistor, one inductor and one capacitor.

8. The method of claim 1, wherein the step of coupling the RLC model and the device together further includes coupling a voltage terminal inductor and a ground terminal inductor to the RLC model and the device, wherein the voltage terminal inductor and the ground terminal inductor are of equal value.

9. The method of claim 1, further comprising a step of testing the second order transfer function by comparing a response curve of the second order transfer function with a response curve of the phase locked loop.

10. The method of claim 1, further comprising a step of testing the RLC model by comparing a response curve of the RLC model with at least one of:
   a response curve of the second order transfer function; and
   a response curve of the phase locked loop.

11. A system for measuring performance of a device dedicated to a phase locked loop, the system comprising:
   means for representing the phase locked loop with a second order transfer function;
   means for generating a resistor-inductor-capacitor (RLC) model based on the second order transfer function;
   means for coupling the RLC model and the device together to make a test circuit; and
   means for analyzing a characteristic of the test circuit to determine the performance of the device.

12. The system of claim 11, wherein the representing means measures a response curve of the phase locked loop and determines a resonance frequency and a bandwidth based on the response curve.

13. The system of claim 12, wherein the representing means further calculates a dampening factor and a natural frequency based on the resonance frequency and the bandwidth.

14. The system of claim 11, wherein the generating means:
   randomly selects a value for a capacitor in the RLC model;
   calculates a value for an inductor based on the value of the capacitor and a value of a natural frequency of the second order transfer function; and
   calculates a value for a resistor based on the value of the capacitor, the value of the inductor and a dampening factor of the second order transfer function.

15. The system of claim 11, further comprising means for testing the RLC model, wherein the means for testing the RLC model compares a response curve of the RLC model with at least one of:
   a response curve of the second order transfer function; and
   a response curve of the phase locked loop.

16. A computer program product comprising a computer usable medium having computer readable program code embodied therein for measuring performance of a device dedicated to a phase locked loop, the program product comprising:
   program code configured to represent the phase locked loop with a second order transfer function;
   program code configured to generate a resistor-inductor-capacitor (RLC) model based on the second order transfer function;
   program code configured to design a coupling of the RLC model and the device together to make a test circuit; and
   program code configured to analyze a characteristic of the test circuit to determine the performance of the device.

17. The program product of claim 16, wherein the program code configured to represent the phase locked loop is further configured to measure a response curve of the phase locked loop and to determine a resonance frequency and a bandwidth based on the response curve.

18. The program product of claim 17, wherein the program code configured to represent the phase locked loop is further configured to calculate a dampening factor and a natural frequency based on the resonance frequency and the bandwidth.

19. The program product of claim 16, wherein the program code configured to generate the RLC model is further configured to:
   randomly select a value for a capacitor in the RLC model;
   calculate a value for an inductor based on the value of the capacitor and a value of a natural frequency of the second order transfer function; and
   calculate a value for a resistor based on the value of the capacitor, the value of the inductor and a dampening factor of the second order transfer function.

20. The program product of claim 16, further comprising program code configured to test the RLC model by comparing a response curve of the RLC model with at least one of:
   a response curve of the second order transfer function; and
   a response curve of the phase locked loop.

* * * * *